(12) United States Patent
Yokokawa et al.

(10) Patent No.: US 8,053,334 B2
(45) Date of Patent: Nov. 8, 2011

(54) METHOD FOR FORMING SILICON OXIDE FILM OF SOI WAFER

(75) Inventors: Isao Yokokawa, Annaka (JP); Nobuhiko Noto, Annaka (JP); Shin-ichi Yamaguchi, Chikuma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 60 days.

(21) Appl. No.: 12/450,955

(22) PCT Filed: Apr. 25, 2008

(86) PCT No.: PCT/JP2008/001101
§ 371 (c)(1),
(2), (4) Date: Oct. 20, 2009

(87) PCT Pub. No.: WO2008/149487
PCT Pub. Date: Dec. 11, 2008

(65) Prior Publication Data
US 2010/0112824 A1    May 6, 2010

(30) Foreign Application Priority Data
May 29, 2007  (JP) .................................. 2007-142338

(51) Int. Cl.
*H01L 21/30* (2006.01)
*H01L 21/316* (2006.01)
(52) U.S. Cl. .......................... 438/459; 438/455; 438/457
(58) Field of Classification Search .......... 438/149–166, 438/295, 311, 404–413, 458–459, 479–481, 438/967
See application file for complete search history.

(56) References Cited

U.S. PATENT DOCUMENTS
5,599,722 A    2/1997  Sugisaka et al.
(Continued)

FOREIGN PATENT DOCUMENTS
EP           0 444 943 A1    9/1991
(Continued)

OTHER PUBLICATIONS
Search Report issued in European Patent Application No. 08751626.6, on Jun. 1, 2010.

*Primary Examiner* — N Drew Richards
*Assistant Examiner* — Mamadou Diallo
(74) *Attorney, Agent, or Firm* — Oliff & Berridge, PLC

(57) ABSTRACT

The invention is a method for forming a silicon oxide film of an SOI wafer, the method by which at least thermal oxidation treatment is performed (a process (A)) on an SOI wafer having an oxide film on the back surface and, after the thermal oxidation treatment, heat treatment is additionally performed (a process (B)) in a non-oxidizing atmosphere at a temperature higher than the temperature at which the thermal oxidation treatment was performed, whereby a silicon oxide film is formed on the front surface of an SOI layer. This provides a method for forming a silicon oxide film of an SOI wafer, the method that can prevent an SOI wafer from being warped after thermal oxidation treatment even when an SOI wafer having a thick oxide film on the back surface is used and a silicon oxide film for forming a device is formed by thermal oxidation on the front surface on the SOI layer side, and can reduce exposure failure and adsorption failure caused by warpage of the SOI wafer and enhance yields of device fabrication.

8 Claims, 2 Drawing Sheets

U.S. PATENT DOCUMENTS

| | | | |
|---|---|---|---|
| 5,989,981 A | 11/1999 | Nakashima et al. | |
| 2006/0281234 A1* | 12/2006 | Sugiyama et al. | 438/151 |

FOREIGN PATENT DOCUMENTS

| EP | 0 817 248 A2 | 1/1998 |
| EP | 1 688 991 A8 | 8/2006 |
| EP | 1 705 704 A1 | 9/2006 |
| JP | A-63-004624 | 1/1988 |
| JP | A-64-033935 | 2/1989 |
| JP | A-02-248045 | 10/1990 |
| JP | A-05-226620 | 9/1993 |
| JP | B2-06-080624 | 10/1994 |
| JP | A-07-153835 | 6/1995 |
| JP | A-08-222715 | 8/1996 |
| JP | A-10-074922 | 3/1998 |
| JP | A-11-345954 | 12/1999 |
| JP | A-2007-073768 | 3/2007 |

* cited by examiner

[Fig. 1]
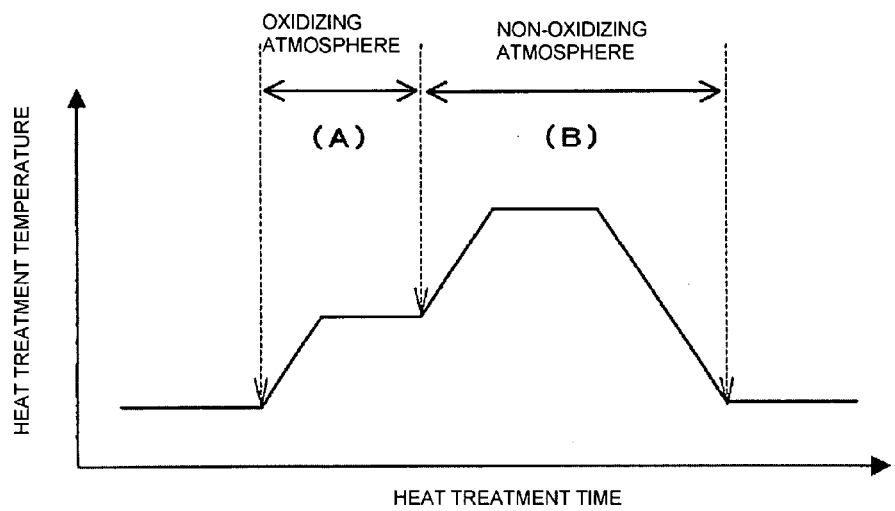

[Fig. 2]
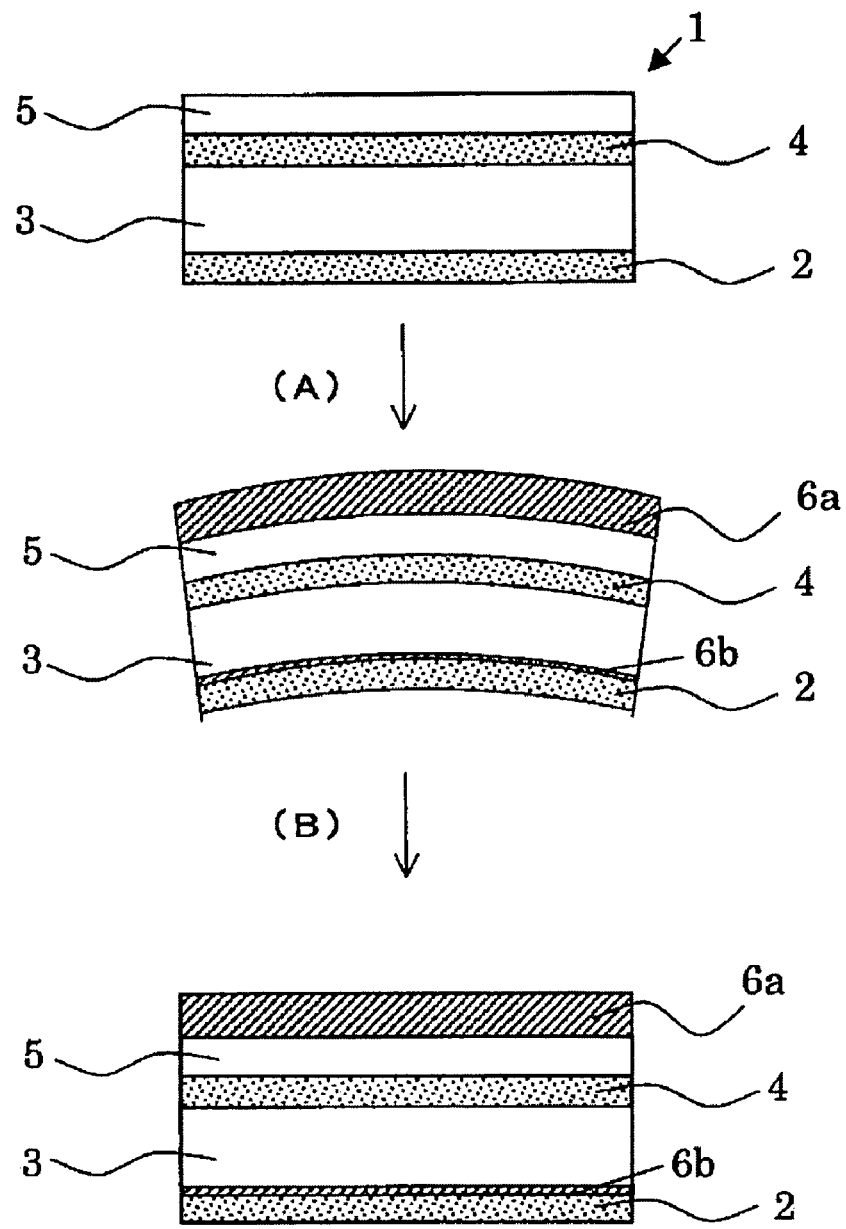

METHOD FOR FORMING SILICON OXIDE FILM OF SOI WAFER

TECHNICAL FIELD

The present invention relates to a method for forming a silicon oxide film of an SOI wafer when forming, by using an SOI wafer having a thick oxide film on the back surface on the base wafer side, mainly a silicon oxide film for fabricating a device by thermal oxidation on the front surface on the SOI layer side.

BACKGROUND ART

One of the wafers for a semiconductor device is an SOI (Silicon On Insulator) wafer having a silicon layer (hereinafter also referred to as an SOI layer) formed on a buried oxide film, which is an insulator film. The SOI wafer has features such as small parasitic capacitance and high radiation resistance because an SOI layer in a substrate surface part which becomes a device fabrication region is electrically separated from the inside of a substrate by a buried insulator layer (a buried oxide film layer (BOX layer)). Therefore, the SOI wafer is expected to produce the effects such as high-speed and low-power consumption operation and prevention of a soft error, and is regarded as a promising substrate for a high-performance semiconductor device.

In many cases, the SOI wafer having a structure composed of a base wafer, a BOX layer, and an SOI layer is generally produced by a bonding method. The bonding method is a method by which an SOI wafer is produced as follows. For example, after forming a silicon oxide film on the front surface of at least one of two silicon single crystal wafers, the two wafers are brought into intimate contact with each other via the oxide film thus formed, bonding strength is increased by performing bonding heat treatment, and one of the wafers (a wafer forming an SOI layer (hereinafter a bond wafer)) is then thinned by mirror polishing or a so-called ion implantation delamination method.

In the above-described bonding method, since a coefficient of thermal expansion of a silicon single crystal forming the base wafer and the SOI layer is different from that of a silicon oxide film forming the BOX layer by an order of magnitude or more, when bonding heat treatment is performed after the two wafers are laid one on top of another via the oxide film, residual stress accumulates in the base wafer and the bond wafer, the residual stress due to the difference in coefficient of thermal expansion between these wafers and the BOX layer. At this point, when the oxide films on the bond wafer and the base wafer have the same thickness, no noticeable warpage occurs in the bonded wafer thanks to well-balanced residual stress. However, when an SOI layer is formed thereafter by thinning the bond wafer, the SOI wafer thus produced lacks in stress balance, and the front surface thereof on which the SOI layer is present is convexly curved.

When such a warped SOI wafer is used in a device fabrication process, exposure failure and adsorption failure occur, leading to a reduction in yields of device fabrication. It is for this reason that wafer makers have developed production methods for reducing warpage of an SOI wafer by a variety of techniques (for example, see JP-B-6-80624, JP-A-11-345954, and JP-A-2007-73768).

On the other hand, in recent years in particular, with the advancement of the technology to fabricate a semiconductor device, the variety thereof has been increased. As described in JP-A-2007-73768, some wafer makers produce an SOI wafer having an extremely thick buried insulator layer with a thickness of 2 μm or more or 10 μm or more, for example.

As described above, in particular, when an SOI wafer having a thick BOX layer is produced, if a thermal oxide film which will become a BOX layer is formed only on a bonding surface of the base wafer, a reaction part (a silicon oxide film) expands to about two times its initial volume as a result of oxygen forcefully entering the Si—Si bonding. As a result, the base wafer itself is convexly curved toward a side thereof on which the silicon oxide film is formed. Therefore, as a result of both surfaces (the entire surface) of the base wafer having formed thereon a silicon oxide film having the same thickness, residual stress due to cubical expansion is produced in the thick silicon oxide film formed on the base wafer. However, the stress balance is equilibrated, whereby warpage of the wafer is cancelled out. Thus, for example, when an SOI wafer having a thick BOX layer is produced, a thick silicon oxide film is formed on the entire surface of the base wafer, and, in an SOI wafer production process that follows, in most cases, a back surface oxide film of the base wafer is not removed.

At the time of shipment of an SOI wafer, in response to requests from device makers, the wafer makers ship the SOI wafer with the thick oxide film on the back surface (on the base wafer side) of the SOI wafer, or ship the SOI wafer after removing the oxide film on the back surface. When it is necessary to use an SOI wafer that suffers less warpage in device fabrication in order to alleviate exposure failure and adsorption failure of a wafer, the device makers also often perform device fabrication processing on the SOI wafer with the back surface oxide film.

However, even when warpage is ingeniously reduced by controlling balance of residual stress accumulated in each layer of an SOI wafer when an SOI wafer having a thick buried insulator film is produced, and an SOI wafer with the back surface oxide film as described above is shipped to the device maker, if the device maker forms a silicon oxide film for fabricating a device on the front surface of the SOI layer, the SOI wafer is sometimes warped greatly after thermal oxidation treatment.

This is caused by the following phenomenon. When thermal oxidation is performed on an SOI wafer having a thick back surface oxide film for reducing warpage, since an oxidation rate is proportional to the square root of the time, almost no oxide film is grown on the back surface side on which the back surface oxide film is left, and the oxide film is grown mainly on the front surface on the SOI layer side. Furthermore, high internal stress is produced in the oxide film formed on the SOI layer side of the SOI wafer due to cubical expansion occurring when the silicon oxide film is grown.

DISCLOSURE OF INVENTION

The present invention has been made in view of the problem described above, and an object thereof is to provide a method for forming a silicon oxide film of an SOI wafer, the method that can prevent an SOI wafer from being warped after thermal oxidation treatment even when an SOI wafer having a thick oxide film on the back surface on the base wafer side is used and a silicon oxide film for fabricating a device is formed by thermal oxidation on the front surface on the SOI layer side, and can reduce exposure failure and adsorption failure caused by warpage of the SOI wafer and enhance yields of device fabrication.

To achieve the above object, the present invention provides a method for forming a silicon oxide film of an SOI wafer, the method by which at least thermal oxidation treatment is performed on an SOI wafer having an oxide film on the back surface and a silicon oxide film is formed on the front surface of an SOI layer, wherein, after the thermal oxidation treatment, heat treatment is additionally performed in a non-oxidizing atmosphere at a temperature higher than the temperature at which the thermal oxidation treatment was performed.

As described above, to form a silicon oxide film on the front surface of an SOI layer for an SOI wafer having an oxide film on the back surface, by performing thermal oxidation treatment on the SOI wafer and, after the thermal oxidation treatment, additionally performing heat treatment in a non-oxidizing atmosphere at a temperature higher than the temperature at which the thermal oxidation treatment was performed, even when a thick oxide film is present on the back surface, it is possible to alleviate internal stress in each layer of the SOI wafer and thereby reduce warpage of the SOI wafer. This makes it possible to reduce exposure failure and adsorption failure in later device fabrication and enhance yields of device fabrication.

In this case, it is preferable that the temperature of the heat treatment in the non-oxidizing atmosphere be set at a temperature higher than 1000° C.

As described above, by setting the temperature of the heat treatment in the non-oxidizing atmosphere at a temperature higher than 1000° C., it is possible to alleviate internal stress in the SOI wafer more reliably.

Moreover, it is preferable to use, as the non-oxidizing atmosphere, an atmosphere containing argon or nitrogen as a major ingredient.

As described above, by using, as the non-oxidizing atmosphere, an atmosphere containing argon or nitrogen as a major ingredient, it is possible to eliminate warpage of the SOI wafer easily and at low cost.

Furthermore, as the SOI wafer, an SOI wafer having an oxide film having a thickness of 500 nm or more on the back surface thereof may be used.

As described above, even when an SOI wafer having a thick oxide film having a thickness of 500 nm or more on the back surface thereof is used as the SOI wafer, internal stress produced in thermal oxidation treatment of the SOI wafer can be adequately alleviated, making it possible to reduce warpage of the SOI wafer.

With the method for forming a silicon oxide film of an SOI wafer in accordance with the invention, even when an SOI wafer having a thick oxide film on the back surface on the base wafer side is used and a silicon oxide film for fabricating a device is formed by thermal oxidation on the front surface on the SOI layer side, it is possible to alleviate internal stress in each layer of the SOI wafer and thereby reduce warpage of the SOI wafer after thermal oxidation treatment. This makes it possible to reduce exposure failure and adsorption failure and enhance yields of device fabrication.

BRIEF DESCRIPTION OF DRAWINGS

FIG. 1 is a diagram for explaining a first embodiment of a method for forming a silicon oxide film of an SOI wafer in accordance with the invention; and FIG. 2 is a diagram for explaining warpage of an SOI wafer in the first embodiment.

BEST MODE(S) FOR CARRYING OUT THE INVENTION

As described above, an SOI wafer using mainly a bonding method is often produced with an oxide film formed on the back surface of the SOI wafer due to the production process thereof, and is used with the back surface oxide film thereon so as to make it applicable to a device fabrication process that requires reduction in warpage. In particular, since large warpage would occur in an SOI wafer having a thick buried insulator film (BOX layer), such an SOI wafer is used in most cases with a back surface oxide film.

However, it has been found out that, when thermal oxidation is performed on the SOI wafer with the back surface oxide film, the SOI wafer is warped considerably after thermal oxidation treatment.

This is caused by the following phenomenon. Since an oxidation rate is proportional to the square root of the time, a silicon oxide film is grown mainly on the front surface on the SOI layer side, and almost no silicon oxide film is grown on the back surface side on which the thick back surface oxide film is left. Moreover, although the volume is nearly doubled due to a reaction between Si and oxygen during the growth of the silicon oxide film, simple cubical expansion is not possible. This produces high internal stress in the silicon oxide film.

Therefore, the inventors thought that the amount of warpage was restored to the pre-thermal oxidation treatment amount by removing the silicon oxide film formed on the front surface on the SOI layer side, the silicon oxide film causing the warpage. When the inventors measured the amount of warpage after removing only the silicon oxide film formed on the front surface side of the SOI wafer; they have found out that the amount of warpage was not restored to the pre-thermal oxidation treatment amount.

That is, warpage caused by the thermal oxidation treatment performed on the SOI wafer having an oxide film on the back surface cannot be explained simply by cubical expansion occurring when a silicon oxide film is formed on the front surface on the SOI layer side and the difference in coefficient of thermal expansion between Si and $SiO_2$ in the course of cooling.

Therefore, as a result of intensive research on this phenomenon, the inventors thought that warpage was not restored to the original warpage because displacement (slippage) occurred at all interfaces between a Si layer and a $SiO_2$ layer to achieve stress balance in the SOI wafer at the time of thermal oxidation treatment, and the displacement at the interface was kept as a result of the SOI wafer being cooled to room temperature. Then, the inventors found out that, to eliminate the displacement at the interface, by performing thermal oxidation treatment on an SOI wafer having an oxide film on the back surface and then performing heat treatment in a non-oxidizing atmosphere at a temperature higher than the temperature at which the thermal oxidation treatment was performed, the interface was moved by a viscous flow, making it possible to alleviate internal stress and release the stress produced by the displacement at the interface between the Si layer and the $SiO_2$ layer, and completed the present invention.

Hereinafter, an embodiment of the invention will be explained with reference to the drawings; however, the invention is not limited thereto.

FIG. 1 is a diagram for explaining a first embodiment of a method for forming a silicon oxide film of an SOI wafer in accordance with the invention. Moreover, FIG. 2 is a diagram for explaining warpage of an SOI wafer in the first embodiment.

First, in a process (A), thermal oxidation treatment is performed on an SOI wafer 1 having an oxide film 2 on the back surface.

As the SOI wafer 1, an SOI wafer produced by a bonding method is used. This SOI wafer has a base wafer 3, a BOX layer 4, an SOI layer 5, and a back surface oxide film 2. At this point, the SOI wafer 1 does not suffer warpage, which becomes a problem.

Then, the SOI wafer 1 is placed in a heat treat furnace (not shown), and is subjected to thermal oxidation in an oxidizing atmosphere. During the thermal oxidation, a silicon oxide film 6a is grown on the front surface on the SOI layer 5 side of the SOI wafer 1.

Although a silicon oxide film 6b is grown also on the back surface oxide film 2 side of the SOI wafer 1, the growth of the film is negligible. This is because an oxidation rate of silicon is proportional to the square root of the time. That is, since the oxide film 2 is already formed on the back surface of the SOI wafer 1, at the time of start of thermal oxidation for forming, on the SOI wafer, a silicon oxide film for fabricating a device, the SOI layer 5 which is formed of Si and is the front surface of the SOI wafer 1 and the back surface oxide film 2 which is formed of $SiO_2$ and is the back surface are different from each other in the elapsed oxidation time from the initial Si surface. As a result, when thermal oxidation is performed on the SOI wafer 1 in an oxidizing atmosphere, while the silicon oxide film 6a is rapidly grown on the front surface of the SOI wafer 1, almost no silicon oxide film 6b on the back surface is grown.

Then, since the silicon oxide films 6a and 6b of different thickness are grown on the front and back surfaces of the SOI wafer which suffered almost no warpage before the thermal oxidation treatment, the SOI wafer is warped due to cubical expansion of the silicon oxide film, and displacement occurs at the Si—$SiO_2$ interface to achieve stress balance of the SOI wafer.

Then, when the SOI wafer is cooled as it is to room temperature, the displacement at the Si—$SiO_2$ interface makes the SOI wafer 1 fixed in a warped state. Therefore, in the invention, after the thermal oxidation treatment in the process (A), a process (B) is performed.

In the process (B), after the thermal oxidation treatment in the process (A), the atmosphere in the heat treat furnace (not shown) is changed to a non-oxidizing atmosphere, the temperature is raised from the temperature at which the thermal oxidation treatment was performed without lowering the temperature inside the furnace, and heat treatment is performed at a temperature higher than the temperature at which the thermal oxidation treatment was performed.

As described above, when the silicon oxide film 6a for fabricating a device is formed on the front surface of the SOI layer 5 by using the SOI wafer 1, after performing thermal oxidation treatment in the process (A), by additionally performing the heat treatment process (B) in a non-oxidizing atmosphere at a temperature higher than the temperature at which the thermal oxidation treatment was performed, even when the thick oxide film 2 is present on the back surface, the Si—$SiO_2$ interface is moved by a viscous flow, whereby it is possible to alleviate internal stress of the SOI wafer 1. This makes it possible to reduce warpage of the SOI wafer, the warpage kept by the displacement at the Si—$SiO_2$ interface, reduce exposure failure and adsorption failure in later device fabrication, and enhance yields of device fabrication.

In this process (B), it is preferable that the temperature of heat treatment in a non-oxidizing atmosphere be set at a temperature higher than 1000° C.

By performing heat treatment on the warped SOI wafer at such a high temperature, it is possible to produce a viscous flow at the Si—$SiO_2$ interface reliably. This makes it possible to alleviate internal stress in the SOI wafer more reliably.

Furthermore, it is preferable to use, as the non-oxidizing atmosphere used in the process (B), an atmosphere containing argon or nitrogen as a major ingredient.

By using such an atmosphere, the oxide film is prevented from further growing unintentionally, making it possible to eliminate warpage of the SOI wafer easily and at low cost. In this case, argon or nitrogen may be used alone, or argon and nitrogen may be mixed to form an atmosphere. Alternatively, a gas, which is inactive against silicon, may be mixed into argon or nitrogen.

With the invention described above, even when an SOI wafer having, on the back surface thereof, an oxide film having a thickness of 500 nm or more is used, since internal stress can be adequately alleviated by moving the displacement at the Si—$SiO_2$ interface, the displacement occurring in thermal oxidation treatment performed on the SOI wafer, by a viscous flow, it is possible to reduce warpage of the SOI wafer.

Incidentally, as the first embodiment of the invention, to make heat treatment more efficient, the process (A) in which thermal oxidation treatment is performed in an oxidizing atmosphere and the process (B) in which heat treatment in a non-oxidizing atmosphere is performed are continuously performed on an SOI wafer in the same heat treat furnace without lowering the temperature. However, if the use of a different heat treat furnace is desired when the stage goes from the process (A) into the process (B), the SOI wafer is taken out of the heat treat furnace used in the process (A) and is transferred to a heat treat furnace used in the process (B) after the temperature thereof is lowered to room temperature, and then heat treatment in a non-oxidizing atmosphere may be performed thereon.

When the SOI wafer subjected to thermal oxidation treatment in the process (A) is cooled to room temperature, the displacement at the interface is kept, and the warped SOI wafer is obtained. However, by performing heat treatment in a non-oxidizing atmosphere at a temperature higher than 1000° C., for example, in the process (B), the Si—$SiO_2$ interface is moved by a viscous flow, whereby it is possible to alleviate internal stress and eliminate warpage of the SOI wafer.

Hereinafter, the invention will be explained more specifically by showing an example of the invention and a comparative example; however, the invention is not limited thereto.

Examples 1 and 2 and Comparative Examples 1 and 2

An SOI wafer 1 was produced under the conditions shown in Table 1. Then, on the SOI wafer thus produced, a silicon oxide film for fabricating a device was formed. As a result, warpage of the SOI wafer was also shown in Table 1. An explanation will be described below.

TABLE 1

| | Example 1 | Comparative Example 1 | Example 2 | Comparative Example 2 |
|---|---|---|---|---|
| Bond wafer | Diameter 200 mm, p-type, 10 Ωcm | | | |
| Thickness of bond-side thermal oxide film (nm) | 200 | | 200 | |
| Base wafer | Diameter 200 mm, p-type, 10 Ωcm | | | |
| Thickness of base-side thermal oxide film (nm) | 3000 | | 700 | |
| Hydrogen ion implantation conditions | Implantation energy: 100 keV, dose amount: 8E16/cm$^2$ | | | |
| Delaminating heat treatment | Argon atmosphere, 500° C., 30 minutes | | | |
| Sacrificial oxidation treatment (Removal of damage) | (Oxidation): 900° C., 1 hour, wet oxidation, SOI layer surface oxide film 100 nm (Removal of oxide film): 5% HF solution, overetching is performed to remove the SOI layer surface oxide film completely. As a result, the thickness of the oxide film on the base back surface is reduced by 200 nm. | | | |
| Warpage before full-scale oxidation (μm) | 40 | | | |
| Full-scale oxidation conditions (Common conditions) Temperature at which the wafer is taken in and out: 700° C. Temperature is raised 10° C./min, and is lowered 2° C./min | (Continuous treatment) (A) 1000° C., wet, 1 h + (B) 1100° C., Ar, 2 h | 1000° C., wet, 1 h | (A) 1000° C., wet, 1 h (B) 1100° C., N$_2$, 2 h Between (A) and (B), the wafer is taken out of the furnace. | 1000° C., wet, 1 h |
| Warpage after full-scale oxidation (μm) | 60 | 100 | 50 | 90 |
| Thickness of oxide film on the SOI layer (nm) | 200 | | 200 | |
| Thickness of oxide film on the back surface layer (nm) | 2807 | | 540 | |

Production of an SOI Wafer

First, as a bond wafer which would become an SOI layer, a silicon single crystal wafer which had a diameter of 200 mm, was of p-type, and had a specific resistance of 10 Ωcm was prepared, and, as a base wafer, a silicon single crystal wafer which had a diameter of 200 mm, was of p-type, and had a specific resistance of 10 Ωcm was prepared.

Next, thermal oxidation was performed on the bond wafer and the base wafer, and a silicon oxide film was formed on the entire surface thereof. Here, to compare the effects due to a difference in the thickness of the back surface oxide film, a 3000 nm silicon oxide film was formed on the base wafer in Example 1 and Comparative Example 1, and a 700 nm silicon oxide film was formed on the base wafer in Example 2 and Comparative Example 2. The silicon oxide film left on the back surface of the base wafer would become a back surface oxide film of the SOI wafer. In any of these examples, a 200 nm oxide film was formed on the bond wafer.

Next, an ion implanted layer was formed from the bonding surface side of the bond wafer under the conditions shown in Table 1. Thereafter, the bond wafer was bonded to the base wafer via the silicon oxide film, and delaminating heat treatment was performed, whereby a thin SOI layer was formed on the BOX layer 4. Then, to remove damage of the SOI layer, sacrificial oxidation treatment was performed under the conditions shown in Table 1, and the SOI wafer 1 was produced.

At this point, warpage of each SOI wafer thus produced was measured by a flatness measurement apparatus, and the results revealed that warpage of each SOI wafer was about 40 μm.

Formation of a Silicon Oxide Film for Fabricating a Device

On the SOI wafers of the examples and the comparative examples, thermal oxidation treatment was performed in an oxidizing atmosphere at 1000° C. for 1 hour by wet oxidation, and a 200 nm silicon oxide film was formed on the front surface of the SOI layer.

In the comparative examples, here, the SOI wafers were taken out of the heat treat furnace, and the amounts of warpage thereof were measured.

In Example 1, to carry out the invention, after wet oxidation was performed at 1000° C., the atmosphere in the heat treat furnace was changed from the oxidizing atmosphere to argon which was a non-oxidizing atmosphere at the same temperature, then the temperature was raised to 1100° C., and heat treatment was performed at that temperature for 2 hours. Then, the SOI wafer was taken out of the heat treat furnace, and the amount of warpage thereof was measured.

Moreover, in Example 2, by using a different heat treat furnace, which was prepared in addition to the heat treat furnace by which the silicon oxide film had been formed and was filled with nitrogen, which was a non-oxidizing atmosphere, heat treatment was performed on the SDI wafer having the silicon oxide film at 1100° C. for 2 hours. In this case, when the SOI wafer was transferred from the oxidizing heat treat furnace to the non-oxidizing heat treat furnace, the SOT wafer was cooled to room temperature. Then, the SOI wafer was taken out of the heat treat furnace, and the amount of warpage thereof was measured.

The amounts of warpage of the SOT wafers having the silicon oxide film and produced by the methods of Examples 1 and 2 and Comparative Examples 1 and 2, the film thickness of the silicon oxide film formed on the SOI layer, and the film thickness of the back surface oxide film were shown in Table 1.

The results revealed that, a 200 nm silicon oxide film was formed on the SOI layer in the examples and comparative examples, and in Example 1 and Comparative Example 1 in which a 3000 nm back surface oxidation was formed on the back surface, the thickness was reduced by 200 nm by etching in sacrificial oxidation treatment, and was then grown only by 7 nm in thermal oxidation for a device. It is apparent from the results that, when a silicon oxide film is grown on an SOI wafer having a thick back surface oxide film, the film grows differently on the front and back surfaces of the SOI wafer.

Moreover, it is apparent from a comparison between Example 1 and Example 2 that the thicker the back surface oxide film is, the harder it is for a silicon oxide film to grow on the back surface.

Then, it is apparent from a comparison between the examples and the comparative examples that the examples in which heat treatment of the invention was performed achieve a smaller amount of warpage of the SOI wafer after formation of the silicon oxide film.

As a result, to form a silicon oxide film on the front surface of an SOI layer for an SOI wafer having a thick oxide film on the back surface, by performing, after thermal oxidation treatment, heat treatment in a non-oxidizing atmosphere at a temperature higher than the temperature at which the thermal oxidation treatment was performed, it is possible to alleviate internal stress of the SOI wafer and thereby reduce warpage of the SOI wafer. This makes it possible to reduce exposure failure and adsorption failure in later device fabrication and enhance yields of device fabrication.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for forming a silicon oxide film of an SOI wafer, the method by which at least thermal oxidation treatment is performed on an SOI wafer having an oxide film on a back surface and a silicon oxide film is formed on a front surface of an SOI layer consisting of a silicon single crystal wherein
after the thermal oxidation treatment, only heat treatment is additionally performed in a non-oxidizing atmosphere at a temperature higher than a temperature at which the thermal oxidation treatment was performed.

2. The method for forming a silicon oxide film of an SOI wafer according to claim 1, wherein
a temperature of the heat treatment in the non-oxidizing atmosphere is set at a temperature higher than 1000° C.

3. The method for forming a silicon oxide film of an SOI wafer according to claim 1, wherein
the non-oxidizing atmosphere contains argon or nitrogen as a major ingredient.

4. The method for forming a silicon oxide film of an SOI wafer according to claim 2, wherein
the non-oxidizing atmosphere contains argon or nitrogen as a major ingredient.

5. The method for forming a silicon oxide film of an SOI wafer according to claim 1, wherein
the SOI wafer has an oxide film with a thickness of 500 nm or more on a back surface.

6. The method for forming a silicon oxide film of an SOI wafer according to claim 2, wherein
the SOI wafer has an oxide film with a thickness of 500 nm or more on a back surface.

7. The method for forming a silicon oxide film of an SOI wafer according to claim 3, wherein
the SOI wafer has an oxide film with a thickness of 500 nm or more on a back surface.

8. The method for forming a silicon oxide film of an SOI wafer according to claim 4, wherein
the SOI has an oxide film with a thickness of 500 nm or more on a back surface.

* * * * *